(12) United States Patent
Willmeroth et al.

(10) Patent No.: US 7,943,987 B2
(45) Date of Patent: May 17, 2011

(54) SEMICONDUCTOR COMPONENT WITH A DRIFT ZONE AND A DRIFT CONTROL ZONE

(75) Inventors: Armin Willmeroth, Augsburg (DE); Anton Mauder, Kolbermoor (DE); Franz Hirler, Isen (DE); Stefan Sedlmaier, München (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 804 days.

(21) Appl. No.: 11/874,591

(22) Filed: Oct. 18, 2007

(65) Prior Publication Data

US 2010/0078710 A1    Apr. 1, 2010

(51) Int. Cl.
*H01L 29/76*     (2006.01)
*H01L 29/94*     (2006.01)
*H01L 31/062*    (2006.01)
*H01L 31/113*    (2006.01)
*H01L 31/119*    (2006.01)

(52) U.S. Cl. ......... 257/329; 257/328; 257/346; 257/401

(58) Field of Classification Search .................. 257/329, 257/341, 401, 328, 335, 336, 491, 492, 536, 257/331, 330, 346, 373, 374, 403, 207, 287, 257/500, 502, 578, 900
See application file for complete search history.

(56) References Cited

U.S. PATENT DOCUMENTS 6,853,033 B2    2/2005    Liang et al.

FOREIGN PATENT DOCUMENTS

| DE | 10 2005 039 331 A1 | 2/2007 |
|---|---|---|
| WO | 2007012490 A2 | 2/2007 |
| WO | WO 2007012490 A3 | 2/2007 |

*Primary Examiner* — Chuong A. Luu
(74) *Attorney, Agent, or Firm* — Dicke, Billig & Czaja, PLLC

(57) ABSTRACT

A semiconductor component has a drift zone and a drift control zone, a drift control zone dielectric, which is arranged in sections between the drift zone and the drift control zone, and has a first and a second connection zone, which are doped complementarily with respect to one another and which form a pn junction between the drift control zone and a section of the drift zone.

20 Claims, 10 Drawing Sheets

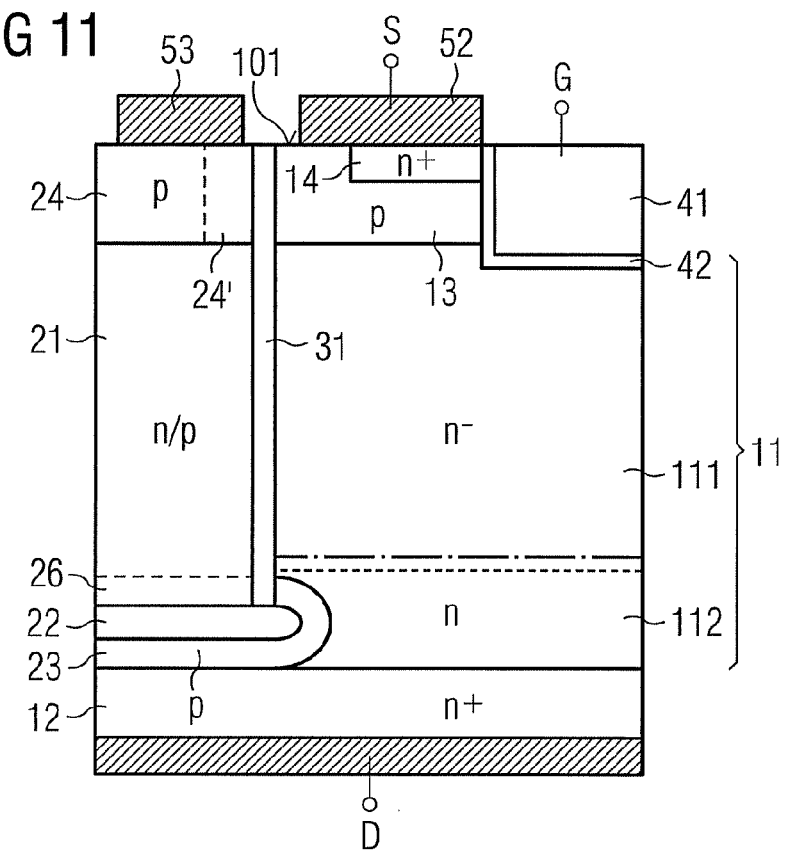
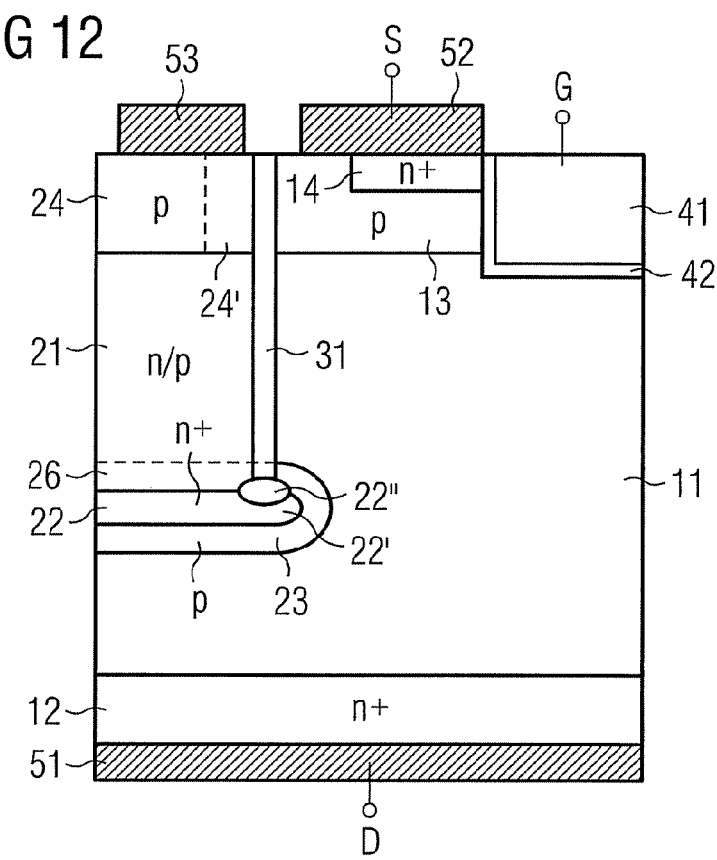

SEMICONDUCTOR COMPONENT WITH A DRIFT ZONE AND A DRIFT CONTROL ZONE

BACKGROUND

One embodiment relates to a semiconductor component having a drift zone arranged between a first and a second component zone, and a drift control zone, which is arranged adjacent to the drift zone, which is dielectrically insulated from the drift zone by a dielectric layer, which is coupled to one of the component zones in such a way that when the component is turned on, in a manner controlled by the drift control zone, a conducting channel forms in the drift zone along the dielectric layer, and which is realized in such a way that a space charge zone can propagate in it when the component is turned off.

In so-called vertical components, a current flow direction when the component is turned on corresponds to a vertical direction of a semiconductor body in which the component is integrated. In the case of such vertical components it is difficult to produce a thin dielectric layer extending in the vertical direction along the entire drift zone. In a vertical component formed as a MOSFET, therefore, it is known to realize the drift control zone such that the latter does not extend along the entire drift zone in the vertical direction, but rather ends in the drift zone and is connected to the drain zone via a tunnel dielectric and a section of the drift zone. However, producing a readily reproducible tunnel dielectric is difficult.

Therefore, there is a need for a semiconductor component with a drift zone and a drift control zone in which a readily reproducible coupling of the drift control zone to one of the component zones is ensured.

SUMMARY

One aspect relates to a semiconductor component having a semiconductor body with a first and a second component zone and with a drift zone arranged between the first and the second component zones, a drift control zone, which is arranged in a first direction adjacent to a first section of the drift zone and which is arranged in a manner spaced apart from the first component zone in such a way that a second section of the drift zone is arranged between the drift control zone and the first component zone, a dielectric layer arranged in the first direction between the drift zone and the drift control zone, a first and a second connection zone, which are doped complementarily with respect to one another and which form a pn junction between the drift control zone and the second section of the drift zone.

One aspect relates to a semiconductor component having a semiconductor body with a first and a second component zone and with a drift zone arranged between the first and the second component zones, a drift control zone, which is arranged in a first direction adjacent to the drift zone, a dielectric layer arranged in the first direction between the drift zone and the drift control zone, a first and a second connection zone, which are doped complementarily with respect to one another and which form a pn junction between the drift control zone and the first component zone, wherein the dielectric layer has, in a second direction running perpendicular to the first direction, a first end arranged in the first connection zone or arranged in a manner spaced apart from the first connection zone, and wherein the second connection zone extends around the first end of the dielectric layer that extends in the second direction in such a way that the second connection zone completely overlaps the first connection zone.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Examples of the present are explained in more detail below with reference to figures. The figures serve for understanding the basic principle of the invention and only show the components or component regions necessary for understanding. The figures are not true to scale. In the figures, unless specified otherwise, identical reference symbols designate identical component regions with the same meaning.

FIG. 11 illustrates a component which is modified relative to the component in accordance with FIG. 10.

FIG. 12 illustrates a component which is modified relative to the component in accordance with FIG. 10 and in which the connection zone extends as far as a first component zone of the semiconductor component.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
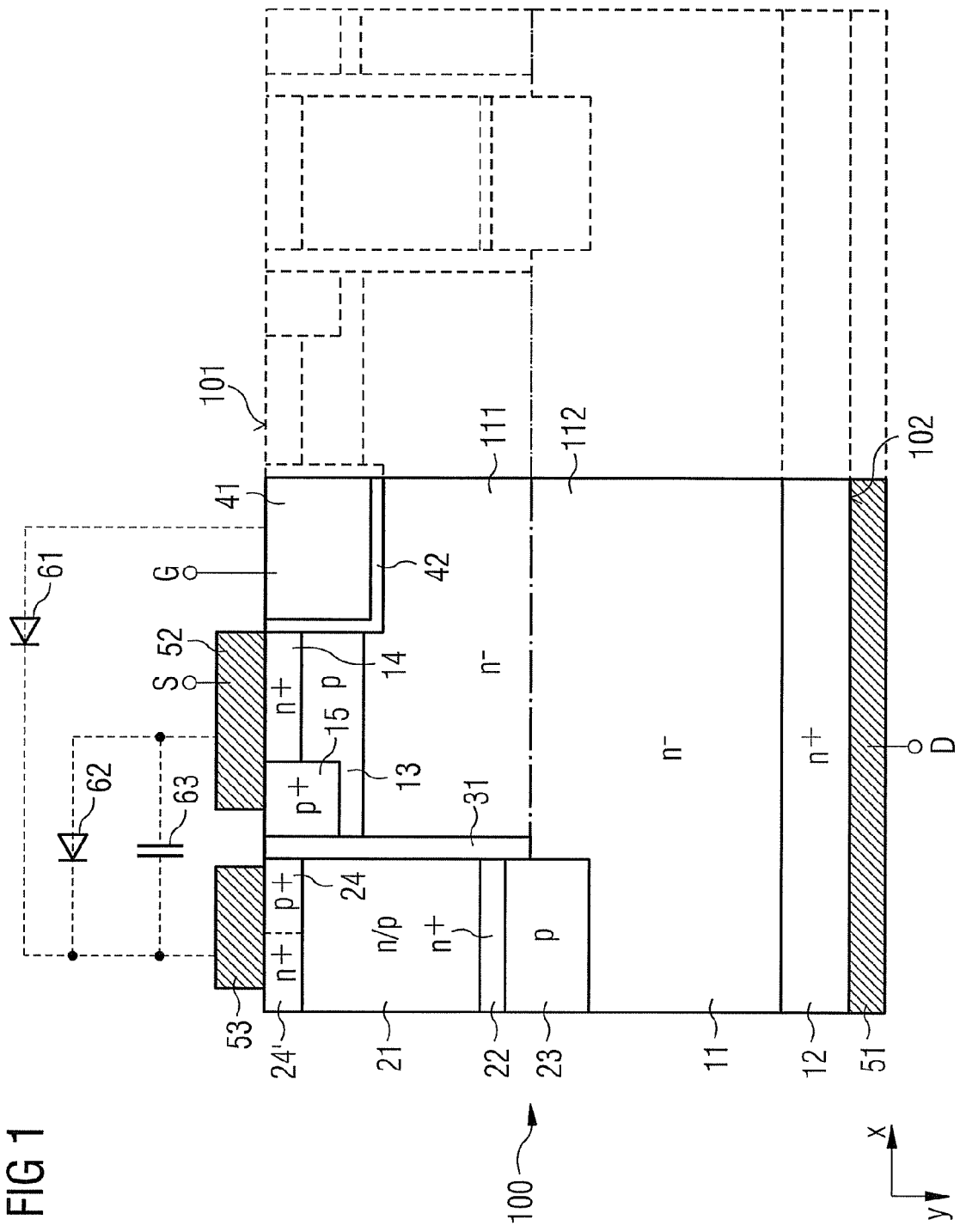
FIG. 1 illustrates an excerpt from a semiconductor component which has a drift zone and a drift control zone, and which is formed as a trench transistor, in cross section.

FIG. 1 illustrates an excerpt from a semiconductor component in accordance with a first example in cross section. The component has a semiconductor body 100 having a first side 101, which is referred to hereinafter as front side, and a second side 102, which is referred to hereinafter as rear side. The semiconductor body is composed of silicon, for example. FIG. 1 illustrates a vertical cross section through the semiconductor body 100, that is to say a cross section in a sectional plane running perpendicular to the front side 101 and the rear side 102.

The component additionally comprises a drift zone 11 arranged in the semiconductor body 100, a drift control zone 21 arranged adjacent to a first section 111 of the drift zone, and a dielectric layer 31 arranged between the drift control zone 21 and the first drift zone section 111, said dielectric layer also being referred to hereinafter as drift control zone dielectric. The drift control zone 21 can be of the same conduction type as the drift zone or can be doped complementarily with respect to the drift zone 11 and can be composed of a monocrystalline semiconductor material.

In the semiconductor component illustrated in FIG. 1, the drift zone 11 is part of a MOSFET structure and is arranged in a current flow direction between a first component zone 12 and a second component zone 13 in the semiconductor body 100. In the component illustrated in FIG. 1, the current flow direction corresponds to a vertical direction, that is to say a direction running perpendicular to the front side 101 and the rear side 102, of the semiconductor body 100. In the MOSFET structure illustrated, the first component zone is a drain zone 12, and the second component zone 13 is a body zone, to which a source zone 14 is adjacent, the body zone 13 separating the drift zone 11 and the source zone 14 from one another. A gate electrode 41 is present for controlling a conducting channel in the body zone 13 between the source zone 14 and the drift zone 11, said gate electrode being dielectrically insulated from the body zone 13 by a gate dielectric 42.

The drain zone 12 is contact-connected by a drain electrode 51, and the source zone 14 is contact-connected by a source electrode 52. In the example illustrated, the source electrode 52 additionally makes contact with the body zone 13 and thereby short-circuits the source zone 14 and the body zone 13. For connecting the source electrode 52 to the body zone 13, in the example illustrated, a connection zone 15 of the same conduction type as the body zone 13 and doped more highly than the body zone 13 is provided, which connection zone is arranged between the source electrode 52 and the body zone 13.

The MOSFET structure illustrated for explanation purposes is a structure of a normally off n-channel MOSFET. In this case, the source zone 14 and the drain zone 12 are n-doped, that is to say doped complementarily with respect to the p-doped body zone 13. In this component, the gate electrode 41 serves for controlling an inversion channel in the body zone 13 between the source zone 14 and the drift zone 11, which is completely n-doped in the example illustrated. The structure illustrated is furthermore a vertical transistor structure; the drain zone 12, the drift zone 11, the body zone 13 and the source zone 14 are in this case arranged adjacent to one another in the vertical direction of the semiconductor body 100. In the example illustrated, said vertical direction of the semiconductor body 100 corresponds to the (main) current flow direction of the component, in which a current flows through the drift zone 11 in a manner yet to be explained when the component is turned on. The transistor structure illustrated is additionally a trench transistor structure. In this case, the gate electrode 41 extends into the semiconductor body 100 proceeding from the front side 101 in the vertical direction and reaches through the source zone 14 and the body zone 13 right into or at least as far as the drift zone 11. In this case, the gate electrode 41 is insulated from the aforementioned component zones by the gate dielectric 42.

In the example illustrated, the drift control zone 21 is arranged adjacent to a first drift zone section 111 in a lateral direction running perpendicular to the vertical direction and is dielectrically insulated from the first drift zone section 111 by the drift control zone dielectric 31. In the vertical direction, the drift control zone 21 is arranged in a manner spaced apart from the drain zone 12 in such a way that a second drift zone section 112 is arranged between the drift control zone 21 and the drain zone 12. In this case, the drift control zone 21 is connected to the second drift zone section 112 via first and second connection zones 22, 23 doped complementarily with respect to one another and is connected to the drain zone 12 indirectly via said second drift zone section 112.

The first connection zone 22 is directly adjacent to the drift control zone 21 and is of the same conduction type as the second drift zone section 112, which is in turn of the same conduction type as the drain zone 12. The second connection zone 23 is doped complementarily with respect to the first connection zone 22 and is arranged between the first connection zone 22 and the second drift zone section 112. The first and second connection zones 22, 23 form a diode, which, in the example illustrated, is forward-biased from the second drift zone section 112 to the drift control zone 21. In the example illustrated, the first connection zone 22 is separated from the drift zone 11 by the drift control zone dielectric 31 in the lateral direction and by the second connection zone 23 in the vertical direction.

The first and second connection zones 22, 23 make it possible, when the component is turned on, for the drift control zone 21 to assume an electrical potential that differs from the electrical potential of the drain zone 12 or of the drift zone 11 in such a way that a conducting channel forms in the drift zone 11—in a manner controlled by the drift control zone 21—along the drift control zone dielectric 31. In the n-conducting component illustrated in FIG. 1, the electrical potential of the drift control zone 21 when the component is turned on in this case lies above the drain potential. In the case of p-channel MOSFET, in which the doping types of the individual component zones are complementary to the doping types illustrated in FIG. 1, the electrical potential of the drift control zone when the component is turned on is below the drain potential.

The first connection zone 22 is for example doped more highly than the second connection zone 23. In this case, the doping concentration of the second connection zone 23 and the dimensions thereof between the first connection zone 22 and the second drift zone section 112 crucially determine the potential difference by which the electrical potential of the drift control zone 21 when the component is turned on can rise above the electrical potential of the second drift zone section 112. The doping concentration and the dimensioning of the second connection zone 23 are chosen for example such that the reverse voltage of the diode formed by the first and second connection zones 22, 23 is higher than the potential differences occurring during normal operation between the drift control zone 21 and the drift zone 11 and respectively the drain zone 12. This dielectric strength is for example between 10V and 20V. To summarize, the first and second connection zones 22, 23 prevent the drift control zone 21 from being discharged in the direction of the second drift zone section 112 or the drain zone 12 when the component is turned on, provided that the potential difference between the drift control zone 21 and the second drift zone section 112 does not exceed the breakdown voltage of the pn junction formed by the connection zones 22, 23.

When the component is turned off, the first and second connection zones 22, 23 couple the second drift zone section 112 to the drift control zone 21 in potential terms. In this case, a potential difference between sections of the drift control zone 21 and the second drift zone section 112 which are directly adjacent to the connection zone 22, 23 corresponds at most to the forward voltage of the pn junction formed by the connection zones 22, 23. The drift control zone 21 is realized such that a space charge zone can propagate in the drift control zone 21 when the component is turned off. For this purpose, the drift control zone 21 is composed for example of a monocrystalline semiconductor material.

The functioning of the semiconductor component illustrated in FIG. 1 is explained below: The component illustrated turns on when a voltage is applied between the drain zone 12 and the source zone 14 or the drain electrode 51 and the source electrode 52 and when a drive potential suitable for forming an inversion channel in the body zone 13 is applied to the gate electrode 41. In the case of the n-MOSFET illustrated, the voltage to be applied between drain and source D, S is a positive voltage, and the drive potential of the gate electrode 41 is a positive potential relative to source potential. In addition, the drift control zone 21 is charged to an electrical potential lying above the electrical potential of the drain zone 12 and hence above the electrical potential of the first drift zone section 111. As a result, a conducting channel—an accumulation channel in the example—forms along the drift control zone dielectric 31 in the first drift zone section 111, said channel bringing about a significant reduction of the on resistance of the component illustrated in comparison with a component that does not have such a drift control zone.

The charge carriers required for charging the drift control zone 21 to an electrical potential above the drift zone 11 are supplied by means of a charging circuit—for example from the gate circuit of the MOSFET. Such a charging circuit includes for example a rectifier element 61, for example, a diode, which is connected between the gate electrode 41 and a further connection zone 24 of the drift control zone 21. In a manner not specifically illustrated, such a charging circuit could also include a charge pump connected between the drain zone 12 or the drain electrode 51 and the further connection zone 24 of the drift control zone 21. The further connection zone 24 makes contact with the drift control zone 21 at an end lying opposite, in the vertical direction of the semiconductor 100, the end at which the first connection zone 22 makes contact with the drift control zone 21. In the example, the further connection zone 24 of the drift control zone 21 is contact-connected by a connection electrode 53, to which the rectifier element 61 is connected. The further connection zone 24 can be doped complementarily with respect to the drift control zone 21, but can be of the same conduction type as the drift control zone 21. In the case of the n-MOSFET illustrated, a p-doped further connection zone 24 provides for a reduction of the contact resistance between the drift control zone 21 and the connection electrode 53 and provides the holes required in the on state for the formation of the accumulation channel along the drift control zone dielectric in the drift control zone. In addition to the p-doped connection zone 24, an n-doped connection zone 24' may be present, these connection zones being short-circuited by the connection electrode 53. When a positive voltage is present between the further connection zone 24 and the drain zone 12, said n-doped connection zone 24' can counteract the triggering of a parasitic thyristor formed on account of the sequence of the p-doped connection zone 24, the drift control zone 21 and the first connection zone 22, the second connection zone 23 and also the drift zone 11 and the drain zone 12.

The component illustrated in FIG. 1 is turned off when a positive voltage is applied between drain D and source S if a drive potential suitable for forming an inversion channel in the body zone 13 is not present at the gate electrode 41. In this case, any space charge zone propagates in the drift zone 12 proceeding from the pn junction between the drift zone 11 and the body zone 13. When the component is turned off, the first and second connection zones 22, 23 prevent the electrical potential in the second drift zone section 112 from being significantly—that is to say by more than the forward voltage of the pn junction—above the electrical potential of the drift control zone 21. In accordance with the drift zone 11, a space charge zone propagates in the drift control zone 21 when the component is turned off. This propagating space charge zone limits the voltage difference between the drift zone 11 and the drift control zone 21 and thereby protects the drift control zone dielectric 31 against a voltage breakdown when the component is turned off.

When a space charge zone propagates in the drift control zone 21, charge carriers are shifted from the drift control zone 21 into a storage capacitance, which can be realized as an external capacitance 63 between the connection electrode 53 and the source electrode 52, but which can also be realized as an integrated storage capacitance. Said charge carriers are positive charge carriers, that is to say holes, in the case of the n-channel MOSFET illustrated. In the case of n-doped drift control zone 21, such a storage capacitance can be realized by a p-doped further connection zone 24 coupled via a dielectric to a region at source potential. In the case of the component in accordance with FIG. 1, such a storage capacitance is formed by a p-doped connection zone 24, that section of the drift control zone dielectric which is adjacent to said connection zone 24, and the connection zone 15 at source potential.

Optionally, a further rectifier element 62, for example a diode, can be connected between the drift control zone 24 and the source electrode 52. Said diode can be designed with regard to its breakdown voltage such that it upwardly limits the electrical potential of the drift control zone, that is to say that it breaks down if the electrical potential of the drift control zone exceeds a predefined value. Such a rise in the electrical potential of the drift control zone may be caused by leakage currents, for example. Said diode 62 can furthermore be realized such that it breaks down before the diode formed by the first and second connection zones 22, 23 breaks down. Via said diode 62, the leakage currents can flow away from the drift control zone 21 to the source electrode 52 and thus do not load the gate circuit or a gate driver circuit (not illustrated) connected to the gate electrode 41.

The first drift zone section 111 arranged adjacent to the drift control zone dielectric 31 in the lateral direction and the second drift zone section 112 arranged between the drift control zone 21 and the drain zone 12 in the vertical direction can be doped differently. Thus, by way of example, the first drift zone section 111 can be more lightly doped than the second drift zone section 112. In principle, the doping concentration of the drift zone 11 lies in the range of $10^{15}$ cm$^{-3}$. The doping concentration of the drift control zone 21 lies in the same range, wherein said drift control zone 21 can be either n-doped or p-doped. The doping concentration of the first and second connection zones lies in the range of between $10^{18}$ cm$^{-3}$ and $10^{19}$ cm$^{-3}$, in principle, wherein the doping concentration of the second connection zone 23 can vary in the vertical direction. At the boundary with the first connection zone 22, the doping is in this case lower and lies for example only in the range of $10^{17}$ cm$^{-3}$, while in the lower region, that is to say the region facing the drift zone, said doping is higher and is for example a factor of 10 higher than the doping at the boundary with the first connection zone 22. A sufficiently high reverse voltage is achieved by virtue of the lower doping at the boundary with the first connection zone 22. The higher doping in the lower region prevents the triggering of a parasitic thyristor that is possibly present. The dimensions of the second connection zone 23 in the vertical direction lie for example between approximately 1 μm and 3 μm.

When the component is turned on, the electrical potential of the drift zone 11 is lower than the electrical potential of the drift control zone 21 in the manner explained. In order to prevent this lower potential of the drift zone 11 from turning on a conducting channel for holes along the drift control zone dielectric in the first connection zone 22, via which channel the drift control zone 21 is discharged, the second connection zone is doped sufficiently highly. In this case, the first connection zone 22 acts as a "channel stopper" for the charge carriers present in the drift control zone 21 when the component is turned on, that is to say positive charge carriers (holes) in the case of the component illustrated.

The component can be constructed in cellular fashion, that is to say can have a number of component structures of identical type, so-called transistor cells, which are connected in parallel by the gate electrodes of the individual transistor cells being electrically conductively connected to one another and by the source zones of the individual transistor cells being electrically conductively connected to one another. In this case, the drift zone 11 and the drain zone 12 are common to all the transistor cells. In the case of a component having the component structures illustrated in FIG. 1, each two transistor cells share a gate electrode 41 and a drift control zone 21. The individual transistor cells can be formed in strip-type fashion; the component zones illustrated then extend in elongated fashion in a direction running perpendicular to the plane of the drawing illustrated in FIG. 1. It goes without saying that any other transistor cell geometries can also be applied, such as, for example, rectangular, square transistor cells, hexagonal transistor cells or any polygonal transistor cells.

The semiconductor body 100 can have for example a highly doped semiconductor substrate, which forms the drain zone 12, and an epitaxial layer applied to the semiconductor substrate, the rest of the component zones explained above being integrated in said epitaxial layer. The production of the body zone 12 with the connection zone 15, the source zone 14 and also the gate dielectric 42 in the epitaxial layer can be effected in a manner that is known in principle, such that further explanations can be dispensed with in this respect.

Possible method steps for producing the drift control zone with the first and second connection zones 22, 23 and the drift control zone dielectric 31 are explained below: a first production method provides for etching a trench in the semiconductor body 100 proceeding from the front side 101, the depth of said trench corresponding to the desired depth of the later drift control zone dielectric 31. A dielectric layer is subsequently produced on the sidewalls and the bottom of said trench, said dielectric layer forming the later drift control zone dielectric 31. Said dielectric layer is produced by means of an oxidation step, for example; the dielectric layer is a thermal oxide in this case. However, the dielectric layer can also be deposited. The dielectric layer is subsequently removed—for example by means of an anisotropic etching method—from the bottom of the trench, such that the dielectric layer remains only on the side walls of the trench, where it forms the later drift control zone dielectric 31. Dopants are subsequently implanted into the trench bottom, the doping type of said dopants being suitable for producing the second connection zone 23. The trench is subsequently filled—for example by means of an epitaxy method—with a monocrystalline semiconductor material, wherein individual sections of this epitaxial layer— as early as during the production of the epitaxial layer or afterward—can be doped differently in order to form the second connection zone 22, the drift control zone 21 and the further connection zone 24. The dopant atoms previously implanted into the trench bottom for producing the second connection zone 22 outdiffuse in the vertical direction both upward and downward, whereby a second connection zone 23 arises, which both extends into the drift zone 11 in the vertical direction but which also overlaps the drift control zone dielectric 31 in the vertical direction.

A further production method provides for producing the first and second connection zones 22, 23, the drift control zone 21 as early as during the production of the epitaxial layer on the semiconductor substrate 12 by means of targeted doping and then for etching a narrow trench into the semiconductor body 100 proceeding from the front side 101, and for producing the drift control zone dielectric 31 in said trench. The further connection zone 34 can be effected by diffusion and/or implantation processes in accordance with the body zone 13, the source zone 14 and the connection zone 15.

Figure 2:
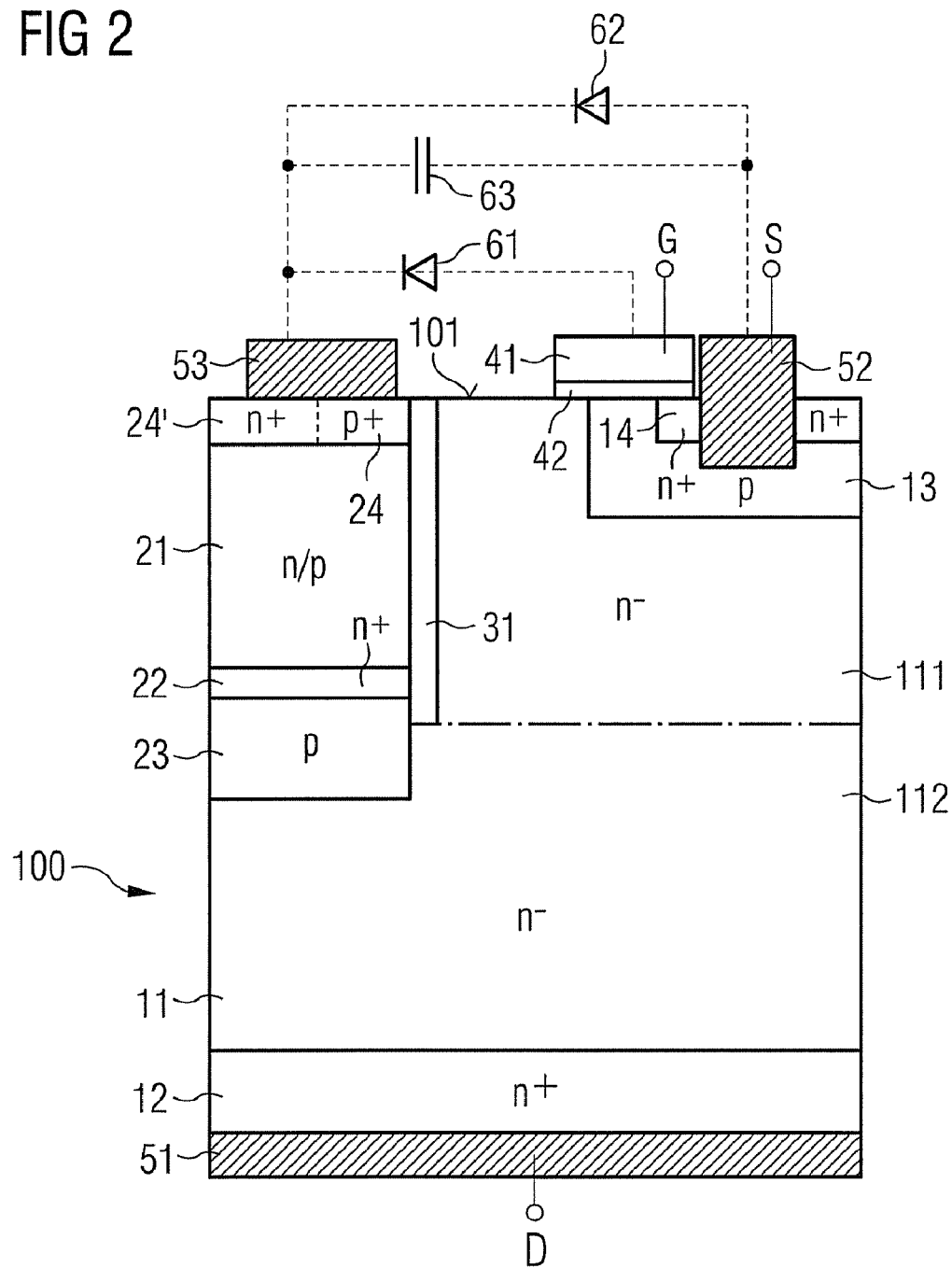
FIG. 2 illustrates an excerpt from a semiconductor component which has a drift zone and a drift control zone, and which is formed as a transistor having a planar gate electrode, in cross section.

It goes without saying that the component concept explained above is not restricted to components with trench transistor structures, but rather can be applied in connection with any transistor structures. FIG. 2 illustrates an excerpt from a semiconductor component which differs from the component illustrated in FIG. 1 by virtue of the fact that the transistor structure is a transistor structure with a planar gate electrode. In this component, the gate electrode 41 is arranged above the front side 101 of the semiconductor body 100 and extends in the lateral direction of the semiconductor body 100 from the source zone 14 over the body zone 13 as far as a section of the drift zone 11 that reaches as far as the front side 101.

Figure 3:
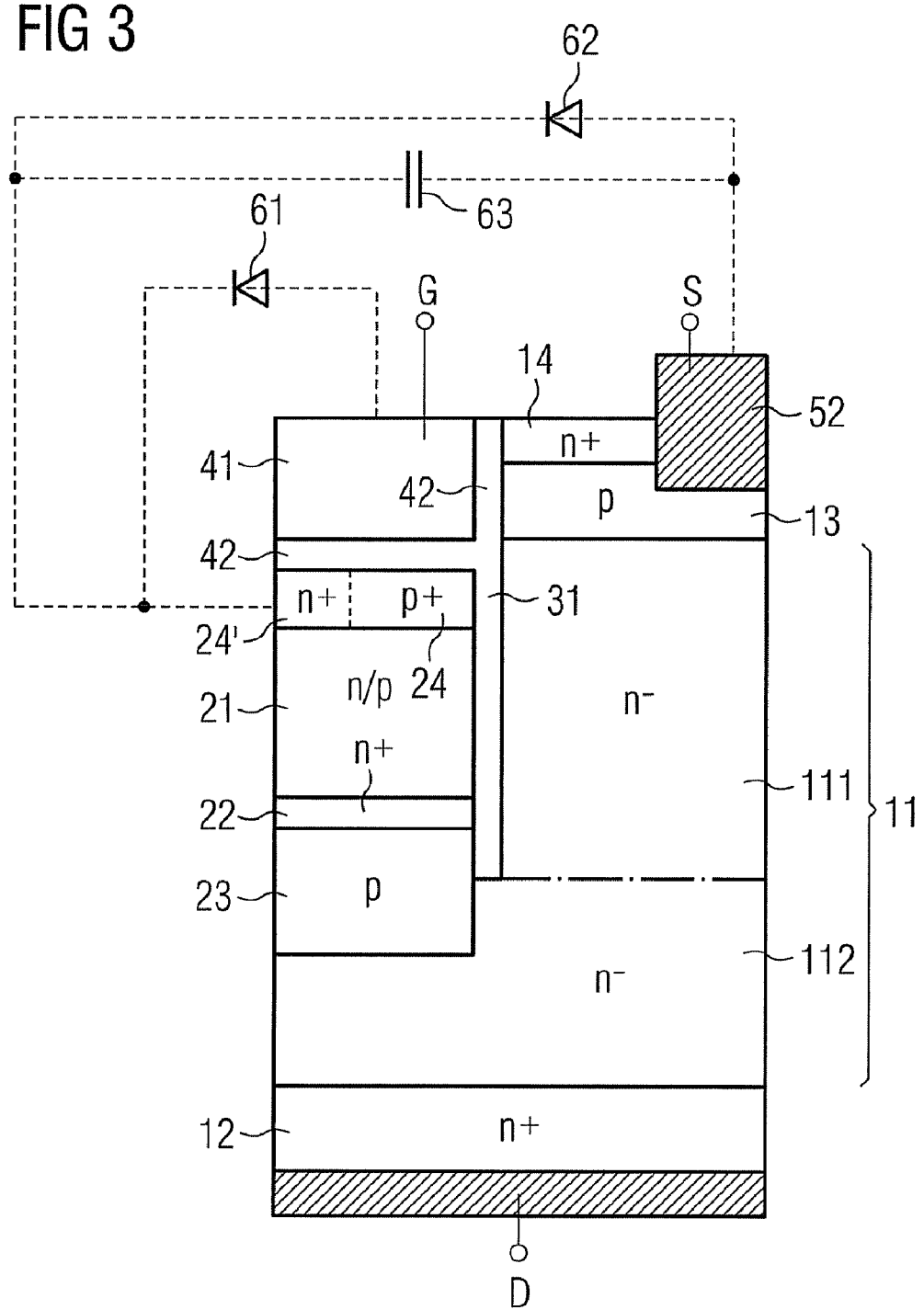
FIG. 3 illustrates a semiconductor component which is modified relative to the component in accordance with FIG. 1 and in which a gate electrode and a drift control zone are arranged in a common trench of a semiconductor body.

FIG. 3 illustrates an excerpt from a cross section of a further semiconductor component with a trench transistor structure. This component differs from the component illustrated in FIG. 1 by virtue of the fact that the gate electrode 41 is arranged above the drift control zone 21 in the vertical direction of the semiconductor body 100. In this component, the source zone 14 and the body zone 13 extend in the lateral direction as far as the gate dielectric 42, which insulates the gate electrode 41 from the drift control zone 21 or the further connection zone 24 in the vertical direction. That section of the gate dielectric 42 which runs in the vertical direction of the semiconductor body 100 and the drift control zone dielectric 31 can be formed by a common dielectric layer in this component.

Figure 4:
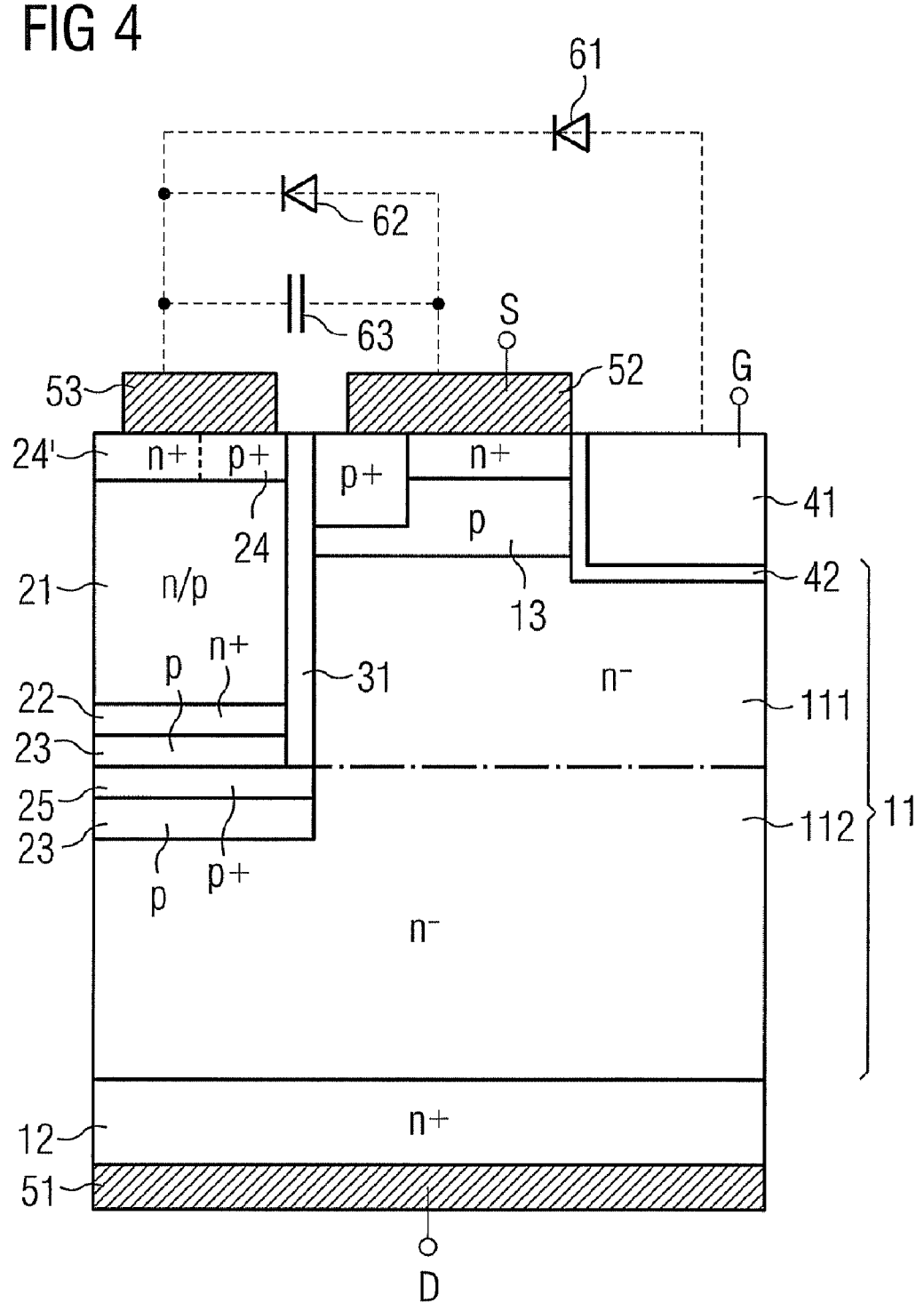
FIG. 4 illustrates a semiconductor component which is modified relative to the component in accordance with FIG. 1.

Referring to FIG. 4, in one example of the component according to the, a further semiconductor zone 25 of the same conduction type as the second connection zone 23 is provided. In the example illustrated, said further semiconductor zone 25 is arranged in the second connection zone 23 in such a way that sections of the second connection zone 23 are adjacent to this highly doped semiconductor zone 25 on both sides in the vertical direction. The dimensions and the doping concentration of said further semiconductor zone 25 is doped such that it is not fully depleted of charge carriers when the component is turned off. The doping concentration of said highly doped zone lies for example in the range of $10^{17}$ cm$^{-3}$ given a dimension in the vertical direction of 0.2 μm, for example. Said further semiconductor zone 25 can be doped more highly than the second connection zone 23. Said semiconductor zone 25 is therefore also referred to hereinafter as highly doped semiconductor zone. Without this further zone 25, the electric field when the component is turned off would not punch through far enough into that section of the drift zone 11 which is arranged below the first and second connection zones 22, 23, with the result that the breakdown voltage would be too low.

The provision of such a further semiconductor zone 25 is independent of the type of transistor structure used. In the case of the component illustrated in FIG. 4, the transistor structure is a trench transistor structure with a gate electrode 41 arranged in a manner spaced apart from the drift control zone 21 in the lateral direction. It goes without saying that the transistor structures explained with reference to FIGS. 2 and 3 and further transistor structures (not illustrated) can also be applied to this component.

The on resistance of the components explained above is crucially determined by the drift zone 11 and, in these components, includes two partial resistances, a first partial resistance, which is crucially determined by the doping concentration of the second drift zone section 112 and the dimensions of said second drift zone section 112 in the vertical direction, and a second partial resistance, which is determined by the distance which the charge carriers have to cover from the inversion channel that forms in the body zone 13 as far as the drift control zone dielectric 31, and the doping concentration of the first drift zone section 111 in this region. In order to reduce the on resistance, the first and the second drift zone section 111, 112 can be doped more highly—with the dielectric strength remaining the same—in the component illustrated in FIG. 5. In this component, compensation zones 161, 162 doped complementarily with respect to the first and second drift zone sections 111, 112 are provided in the drift zone 11. a second compensation zone 162 provided adjacent to the second drift zone section 112 is doped such that a dopant charge of the dopant atoms in said second compensation zone 162 corresponds at least approximately to the dopant charge of the dopant atoms present in the second drift zone section 112. In the component illustrated, the compensation zones 161, 162 are connected directly to the body zone 13. In the turned-off component, dopant atoms of the two drift zone sections 111, 112 are compensated for by the dopant atoms of the compensation zones 161, 162. Proceeding from pn junctions between the drift zone sections 111, 112 and the compensation zones 161, 162, in this case space charge zones propagate in the compensation zones 161, 162 and the drift zone sections 111, 112. In this case, the first drift zone section 111 does not have to completely compensate the first compensation zone 161.

Figure 5:
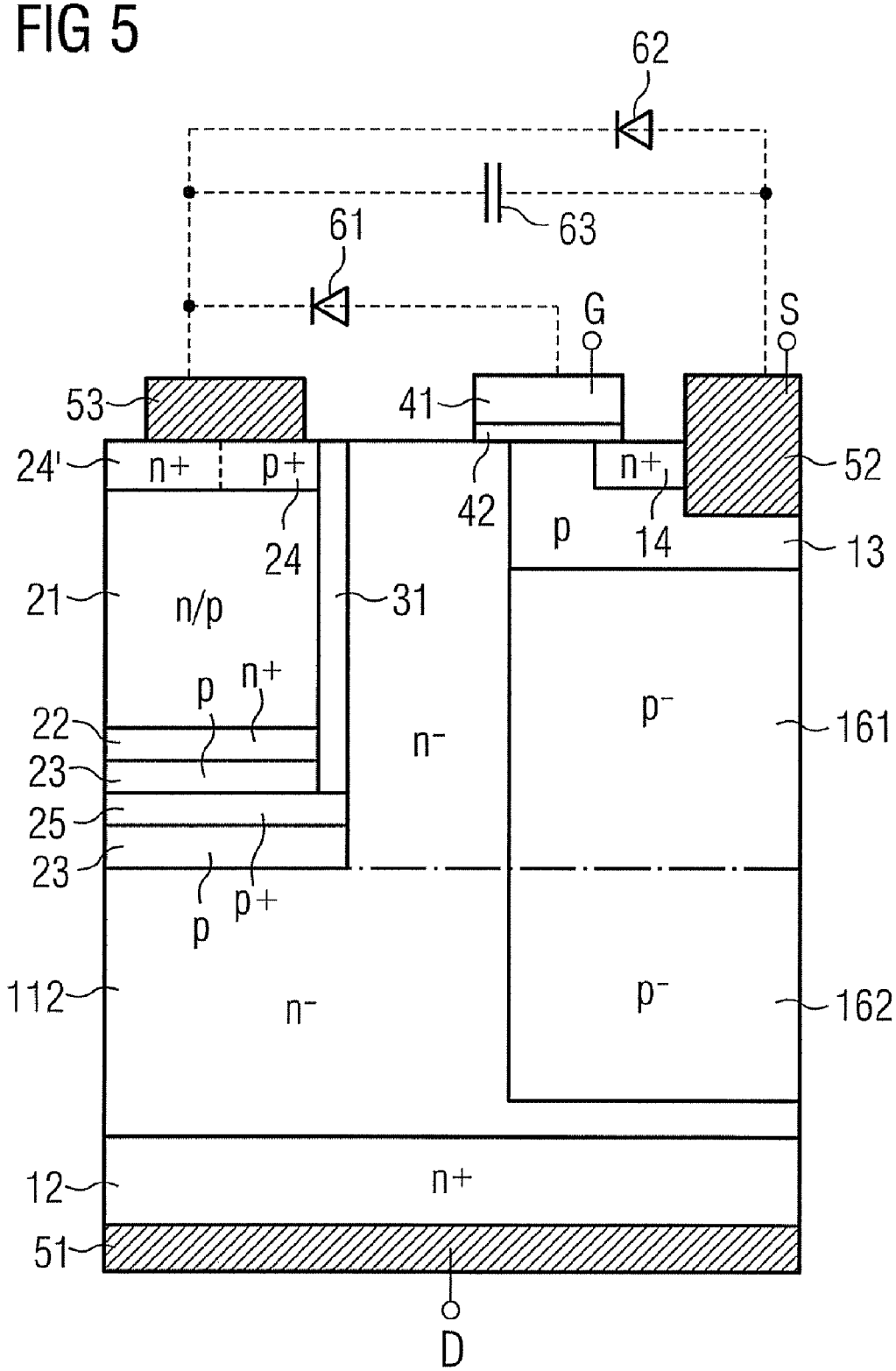
FIG. 5 illustrates a semiconductor component with a drift zone and a drift control zone in which a compensation zone doped complementarily with respect to the drift zone is arranged in the drift control zone.
Figure 6:
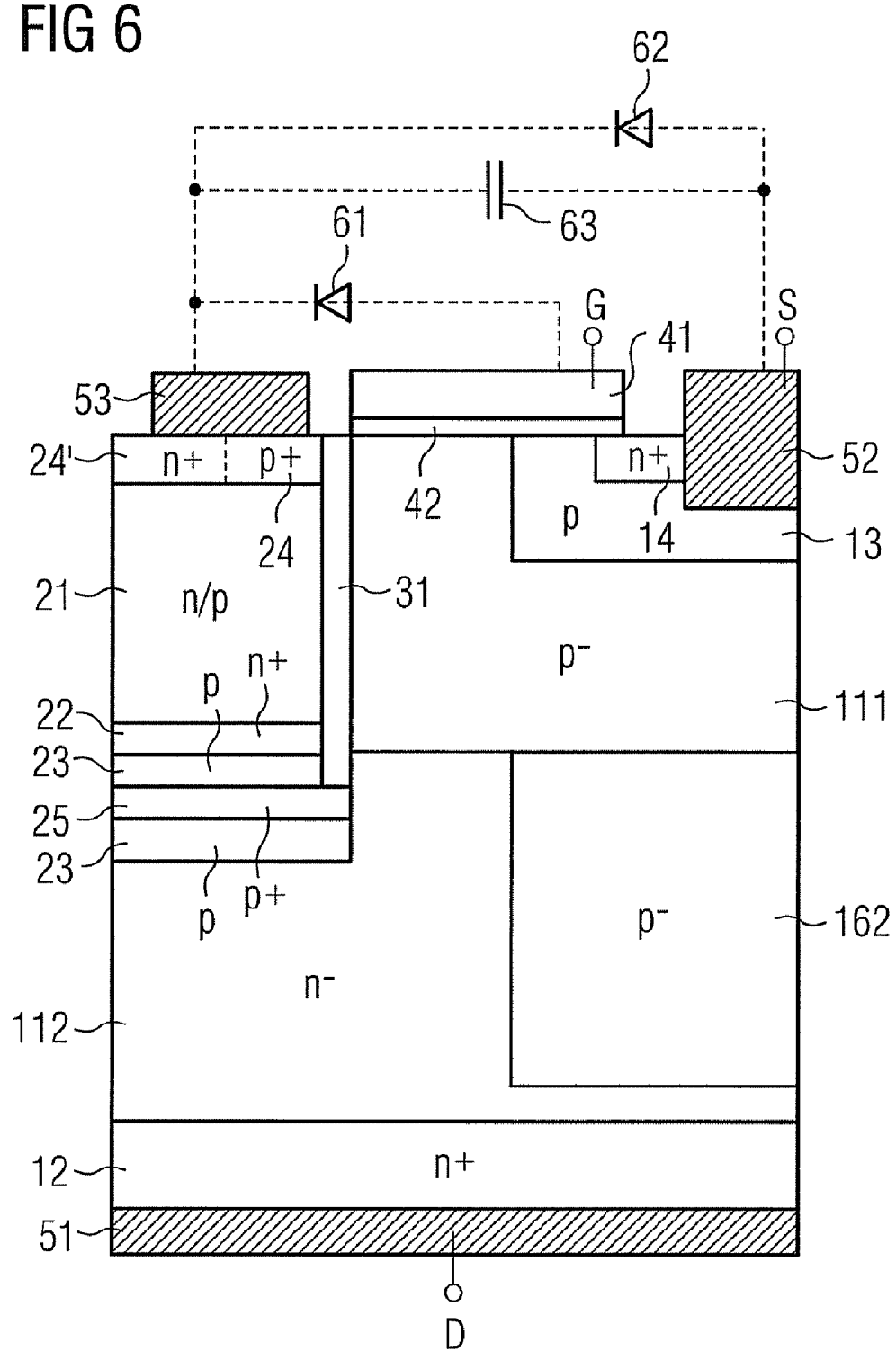
FIG. 6 illustrates a semiconductor component with a drift zone and a drift control zone in which the drift zone has in sections two drift zone sections doped complementarily with respect to one another.

FIG. 6 illustrates a semiconductor component which is modified in comparison with the component in FIG. 5. In this semiconductor component the first drift zone section 111 is doped complementarily with respect to the second drift zone section 112. In this component the transistor structure is chosen such that an inversion channel that forms along the gate dielectric 42 when the component is turned on extends directly as far as the drift control zone dielectric 31. In the component illustrated in FIG. 6, the gate electrode 41 for this purpose is a planar gate electrode 41, which is arranged above the front side 101 of the semiconductor body 100 and which extends in the lateral direction from the source zone 14 over the body zone 13 and that section of the first drift zone section 111 which extends as far as the front side 101, as far as the drift control zone dielectric. In this component the conducting channel along the drift control zone dielectric 31 when the component is turned on is likewise an inversion channel. In this component the n-doped second drift zone section 112 reaches in the vertical direction to the level of the first connection zone 22, but can also extend to the level of the drift control zone 21 in a manner that is not specifically illustrated. This ensures that an inversion channel that forms along the drift control zone dielectric 31 reliably leads into the n-doped second drift zone section 112. Such an inversion channel can form along the dielectric proceeding from the front side only as far as the first connection zone 22.

Figure 7:
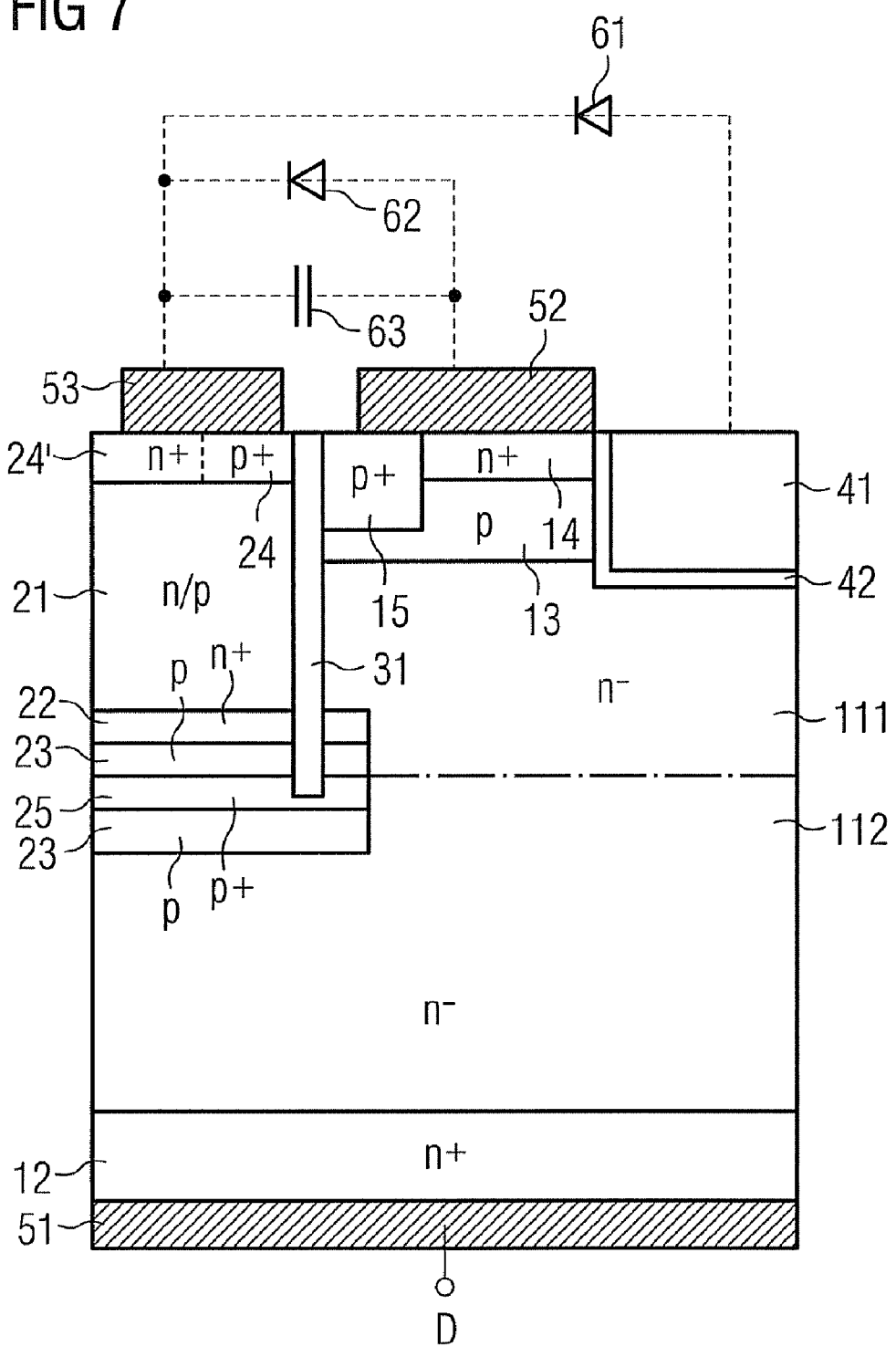
FIG. 7 illustrates a component which is modified relative to the component in accordance with FIG. 4 and in which a connection zone arranged between a drift control zone and a drift zone section extends beyond a dielectric layer arranged between the drift control zone and the drift zone.

In the semiconductor components explained above, the first and second connection zones and the highly doped semiconductor zone 25 optionally present are delimited by the drift control zone dielectric 31 in the lateral direction, or do not reach beyond said drift control zone dielectric 31 in the lateral direction. Referring to the semiconductor component illustrated in FIG. 7, these connection zones can also project beyond the drift control zone dielectric 31 in the lateral direction.

Such an "overlapping" of the connection zones 22, 23 beyond the drift control zone dielectric 31 is accepted for example when the first and second connection zones 22, 23 are produced before the drift control zone dielectric 31 is actually produced. In this case, proceeding from the front side of the semiconductor body, a trench for producing the drift control zone dielectric is etched in such a way that its horizontal position is reliably above the first and second connection zones 22, 23, in order thereby to ensure that the drift control zone 21 is reliably isolated with respect to the drift zone 11 by the first and second connection zones 22, 23.

In this case, the first and second connection zones 22, 23 can extend beyond the drift control zone dielectric 31 over the entire length of the transistor cells—that is to say over the entire length of the drift control zone dielectric 31 in the direction running perpendicular to the plane of the drawing. In a manner not specifically illustrated, there is also the possibility in this case of the first and second connection zones 22, 23 extending beyond the drift control zone dielectric 31 in the lateral direction only in sections. This is favorable with regard to the on resistance of the component since the highly doped connection zone 25 extending beyond the drift control zone dielectric 31 right into the drift zone 10 constitutes a considerable resistance for the conducting channel that forms along the drift control zone dielectric 31, since the electrons have to "flow around" this layer.

Figure 8:
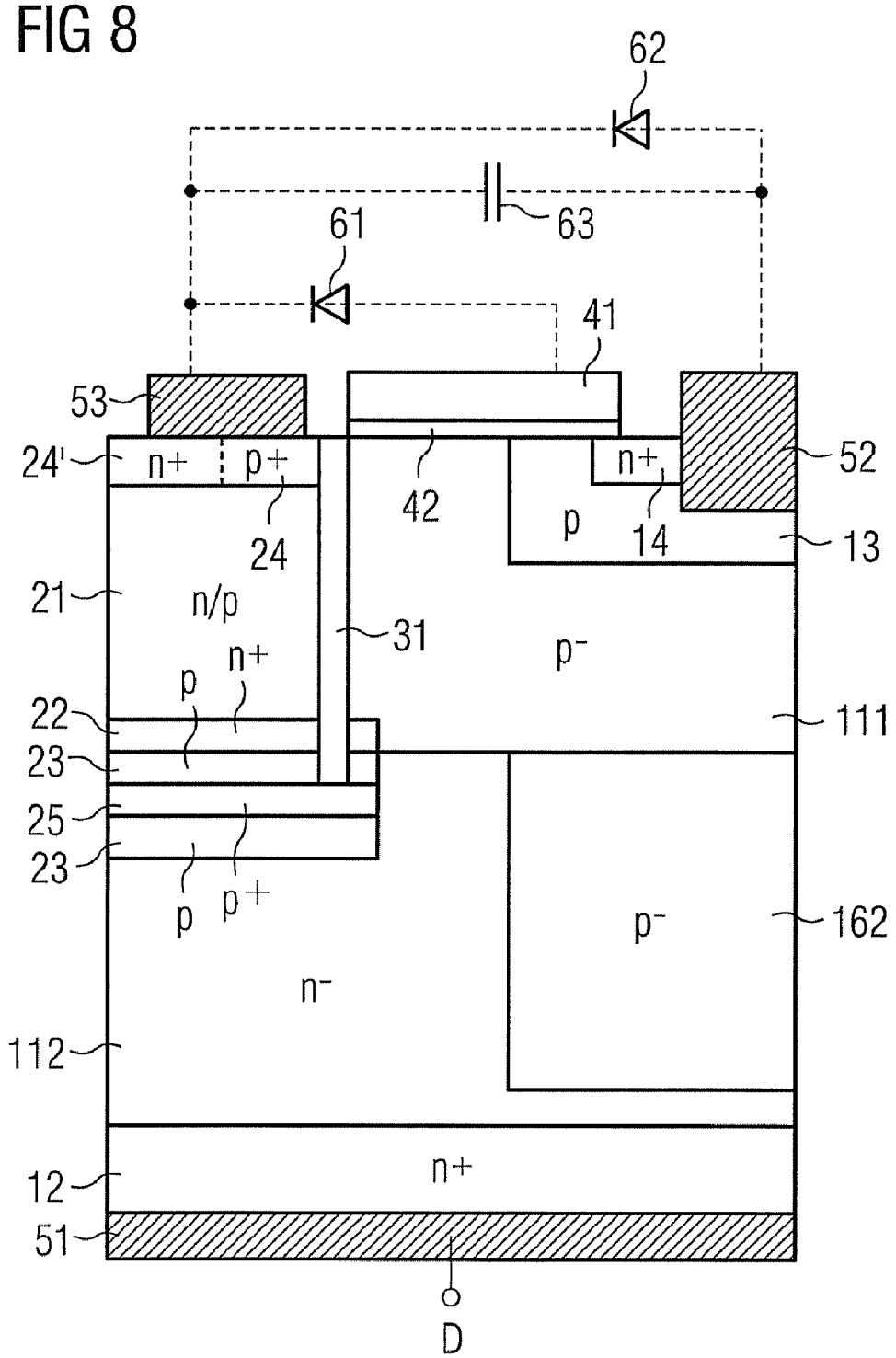
FIG. 8 illustrates a component which is modified relative to the component in accordance with FIG. 7.

A realization of the first and second connection zones 22, 23 in such a way that they extend beyond the drift control zone dielectric 31 in the lateral direction can be applied to any of the component structures explained above, also to the component structure explained above with reference to FIG. 6, in which component structure the first drift zone section 111 is doped complementarily with respect to the second drift zone section 112. FIG. 8 illustrates such a component with drift zone sections 111, 112 doped complementarily with respect to one another and with first and second connection zones 22, 23 of the drift control zone 21 that extend beyond the drift control zone dielectric 31 in the lateral direction. In this component, the n-doped second drift zone section 112 reaches to the level of the first connection zone 22 in the vertical direction, but can also extend to the level of the drift control zone 21 in a manner that is not specifically illustrated. This ensures that an inversion channel that forms along the drift control zone dielectric 31 reliably leads into the n-doped second drift zone section 112.

The geometry of the compensation zones illustrated in FIGS. 5 and 8 corresponds for example to the geometry of the body zone 13, and thus to the geometry of the transistor cells. In the case of strip-type transistor cells, the compensation zones 161, 162 are then formed correspondingly in strip-type fashion and run parallel to the body zone 13 in the components illustrated in FIGS. 5 and 8.

Figure 9:
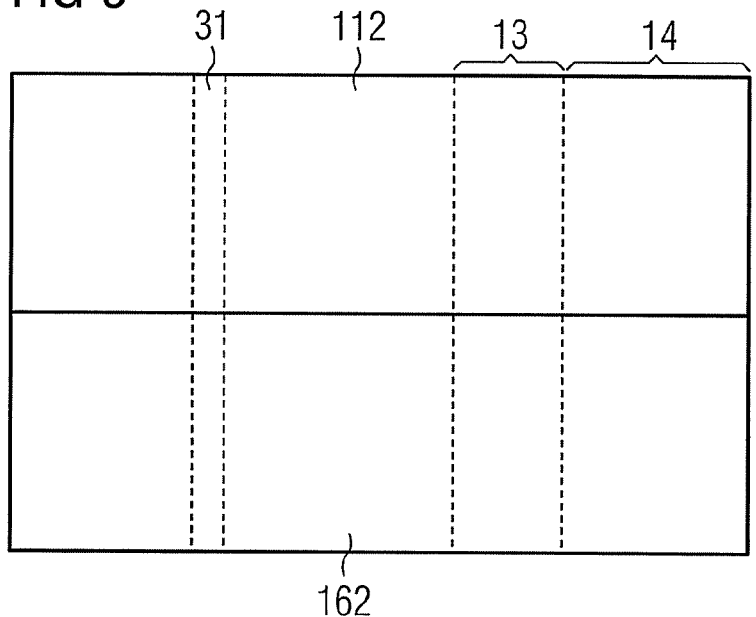
FIG. 9 illustrates an excerpt from a semiconductor component in cross section for illustrating a mutual position of a drift zone and of a compensation zone and also a cell array of the component.

However, the second compensation zone 162 arranged in the second drift zone section 112 can also be realized in such a way that it forms an angle of between 0° and 180° with the body zone 13 or the drift control zone 21. Said second compensation zone 162 can run perpendicular to the body zone 13 and the drift control zone 21, which is illustrated in FIG. 9. FIG. 9 illustrates a horizontal cross section through the semiconductor body 100 in an exemplary embodiment in which the second compensation zone 162 is formed in strip-type fashion and runs in a lateral direction of the semiconductor body perpendicular to the body zone 13, the drift control zone 21 and the drift control zone dielectric 31. The position of the last-mentioned component zones is illustrated by dashed lines in FIG. 9. In this embodiment, the second compensation zone 162 adjoins the second connection zone 23 of the drift control zone 21 in sections.

Figure 10:
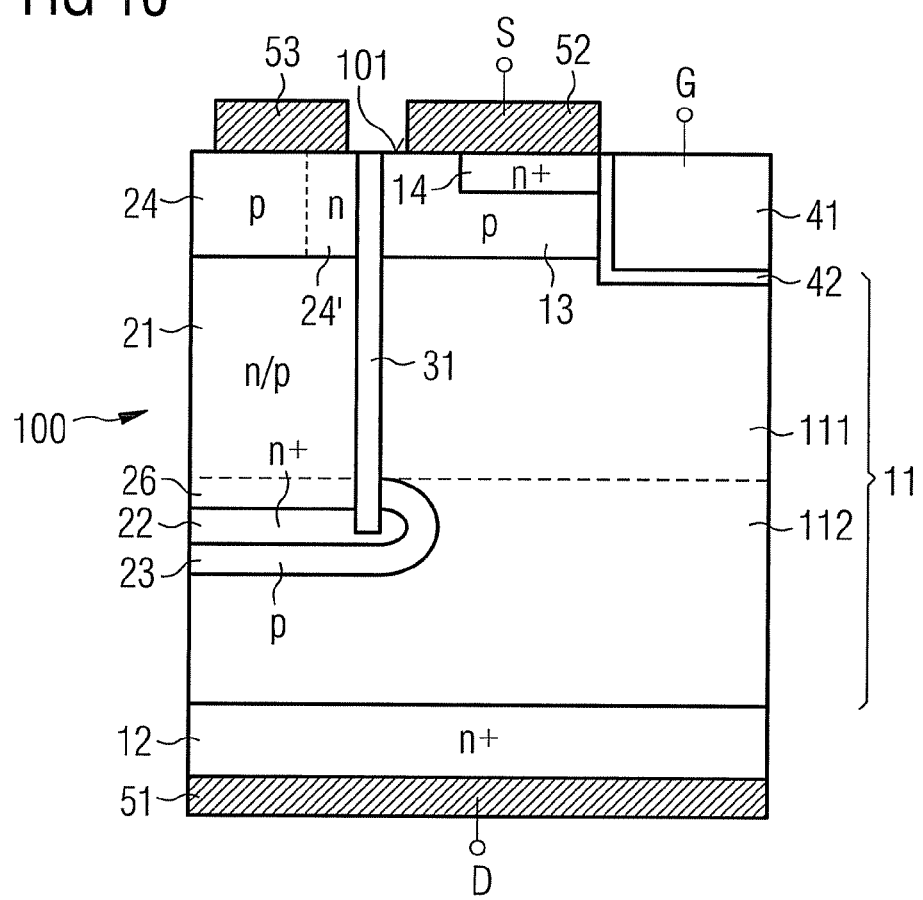
FIG. 10 illustrates an excerpt from a semiconductor component which has a drift zone, a drift control zone and a dielectric layer arranged between the drift zone and the drift control zone and in which the dielectric layer ends in a connection zone adjacent to the drift control zone, in cross section.

FIG. 10 illustrates a vertical cross section through a semiconductor body 100 of a semiconductor component in accordance with a further example. In this component the drift control zone dielectric 31 is realized in such a way that it ends in the first connection zone 22 in the vertical direction of the semiconductor body 100, that is to say that it does not reach beyond said first connection zone 22 in the vertical direction proceeding from the front side 101. Furthermore, in this component the first connection zone 22 is shielded from the drift zone 11 by the complementarily doped second connection zone 23 in the lateral direction of the semiconductor body 100. For this purpose, the second connection zone 23 extends around that end of the drift control zone dielectric 31 which is arranged in the first connection zone 22, and extends in the drift zone 11 in the direction of the front side 101 at least to an extent such that the second connection zone 23 completely overlaps the first connection zone 22 in the vertical direction. The first connection zone 22 prevents the situation in which, when the component is turned on, in the first connection zone 22 along the drift control zone dielectric 31 a channel—a hole channel in the example illustrated—can form for the charge carriers stored in the drift control zone 21. In this component illustrated in FIG. 10, the first connection zone 22 can be more lightly doped than the first connection zone 22 in the exemplary embodiments explained above in which the first connection zone 22 is not shielded from the drift zone 11 by the second connection zone 23, since the potential of 22 is applied through the first connection zone 22, reaching into the drift zone under 31, on the DZ side.

The first connection zone 22 can extend beyond the drift control zone dielectric 31 in the lateral direction, as is illustrated in FIG. 10. In this case, the second connection zone 23 is realized in such a way that it completely surrounds the first connection zone 22 in the drift zone 11, that is to say that the second connection zone 23 reaches as far as the drift control zone dielectric 31 in the drift zone 11. 23 must be able to take up, in the switched-on state, the substantial part of the SCZ which is impressed by the voltage difference between 21 and 11. In the off-state case, 23 must prevent the SCZ formed in the DZ from reaching 22.

A further connection zone 26 doped complementarily with respect to the first connection zone 22 can be provided between the first connection zone 22 and the drift control zone 21, the doping concentration of which further connection zone can correspond to the doping concentration of the second connection zone 22. Said connection zone 26 can result from a special production method in which the first and second connection zones 22, 23 are produced by implantation of dopants and subsequent diffusion processes. In this case, the dopants of the second connection zone 23 are chosen such that they diffuse more rapidly than the dopant atoms of the first connection zone 22. The further connection zone 26 results in this case from the same diffusion process that leads to the production of the second connection zone 23. Said further connection zone 26 has no influence on the functioning of the component.

In the component illustrated in FIG. 10, the first and second connection zones 22, 23 are produced for example during the production of the epitaxial layer which forms the later drift zone 11 in sections. As early as during the production of said epitaxial layer, dopant atoms which form the later first and second connection zones 22, 23 are introduced locally in this case. The drift control zone dielectric 31 can be produced by etching the trench into the semiconductor body 100 proceeding from the front side 101, said trench ending in the second connection zone 22, and by subsequently producing a dielectric layer, for example on oxide, in said trench.

FIG. 11 illustrates a component which is modified in comparison with the component in FIG. 10. In this component in accordance with FIG. 11, the second connection zone 23 is directly adjacent to the drain zone 12 arranged in the region of the rear side 102 of the semiconductor body 100. In this case, the drift zone 11 can have two differently doped drift zone sections, a first, more lightly doped drift zone section 111, which is adjacent to body zone 13, and a second, more highly doped drift zone section 112, which is adjacent to the drain zone 12 and which extends in the vertical direction further in the direction of the front side 101 than—or at least just as far in the direction of the front side 101 as—the second connection zone 23. Such a more highly doped zone 112 can also be provided in the component in accordance with FIG. 10 and is depicted by dashes there.

The component structure with the drift control zone dielectric 31 ending in the first connection zone 22 as illustrated in FIG. 11 could be partly or completely arranged in the drain zone 12. FIG. 11 illustrates in dotted fashion the boundary of the drain zone 12 in a variant in which this component structure is arranged completely in the drain zone 12.

FIG. 12 illustrates a component which is modified in comparison with the component in FIG. 10. In this component the first connection zone has two doped sections 22', 22" of the same conduction type, which are n-doped in the example illustrated. In this case, the position and the dimensions of a first section correspond to the position and the dimensions of the first connection zone explained with reference to FIGS. 10 and 11 (reference symbol 22 therein) with the difference that the drift control zone dielectric ends in or at the second section 22" in this component. This second section 22", in the component in accordance with FIG. 12, fulfils the actual function of a channel stopper and can be doped more highly than the first section 22'. In this case, the dimensions of the second section in the horizontal direction are smaller than those of the first section 22'. The second section 22" can be arranged in the first section 22', but can also project beyond the first section 22' in the direction of the drift control zone, in the manner illustrated in FIG. 12.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor component comprising:
    a semiconductor body with a first and a second component zone and with a drift zone arranged between the first and the second component zones;
    a drift control zone arranged in a first direction adjacent to a first section of the drift zone and arranged in a manner spaced apart from the first component zone such that a second section of the drift zone in a current flow direction of the semiconductor component is arranged between the drift control zone and the first component zone;
    a dielectric layer arranged in the first direction between the drift zone and the drift control zone; and
    a first and a second connection zone, which are doped complementarily with respect to one another and which form a pn junction between the drift control zone and the second section of the drift zone.

2. The semiconductor component as claimed in claim 1, wherein the first and the second component zone are arranged between the drift control zone and the second section of the drift zone in such a way that when the component is turned on, a discharge of the drift control zone in the direction of the second component zone is prevented.

3. The semiconductor component as claimed in claim 1, wherein the first component zone is of the same conduction type as the second section of the drift zone and is adjacent to the drift control zone, and in which the second connection zone is doped complementarily with respect to the second section of the drift zone and is arranged between the first connection zone and the second section of the drift zone.

4. The semiconductor component as claimed in claim 1, wherein a compensation zone doped complementarily with respect to the drift zone is arranged in the drift zone.

5. The semiconductor component as claimed in claim 4, wherein the compensation zone is arranged in the second drift zone section.

6. The semiconductor component as claimed in claim 5, wherein the first drift zone section is doped complementarily with respect to the second drift zone section.

7. The semiconductor component as claimed in claim 5, wherein the second drift zone section and the compensation zone are arranged such that the second drift zone section and the compensation zone are adjacent to the connection zone.

8. The semiconductor component as claimed in claim 4, wherein the compensation zone is connected to the second component zone.

9. The semiconductor component as claimed in claim 1, wherein the first drift zone section is more lightly doped than the second drift zone section.

10. The semiconductor component as claimed in claim 1, wherein a further doped semiconductor zone of the same conduction type is arranged in the second connection zone, the doping concentration and dimensions of which semiconductor zone are chosen such that it cannot be fully depleted.

11. The semiconductor component as claimed in claim 1, wherein the first and the second connection zone extend to beyond the dielectric layer in sections in the first direction.

12. The semiconductor component as claimed in claim 1, which is formed as a MOSFET, in which the first component zone forms a drain zone and the second component zone forms a body zone and which furthermore has:
    a source zone, which is doped complementarily with respect to the body zone and which is separated from the drift zone by the body zone,
    a gate electrode, which is arranged adjacent to the body zone and which is insulated from the body zone by a gate dielectric.

13. The semiconductor component as claimed in claim 12, in which the drift control zone is connected to the gate electrode at a side remote from the connection zone.

14. The semiconductor component as claimed in claim 13, in which the drift control zone is connected to the gate electrode via a rectifier element.

15. The semiconductor component as claimed in claim 12, in which a capacitive charge storage element is connected between the source zone and the drift control zone.

16. A semiconductor component comprising:
    a semiconductor body with a first and a second component zone and with a drift zone arranged between the first and the second component zones;
    a drift control zone arranged in a first direction adjacent to a first section of the drift zone and arranged in a manner spaced apart from the first component zone such that a second section of the drift zone in a current flow direction of the semiconductor component is arranged between the drift control zone and the first component zone;
    a dielectric layer arranged in the first direction between the drift zone and the drift control zone; and
    a first and a second connection zone, which are doped complementarily with respect to one another and which form a pn junction between the drift control zone and the first component zone;
    wherein the dielectric layer has, in a second direction running perpendicular to the first direction, a first end arranged in the first connection zone or arranged in a manner spaced apart from the first connection zone; and
    wherein the second connection zone extends around the first end of the dielectric layer that extends in the second direction in such a way that the second connection zone completely overlaps the first connection zone.

17. The semiconductor component as claimed in claim 16, wherein a section of the drift zone is arranged between the connection zone and the second component zone in the second direction.

18. The semiconductor component as claimed in claim 16, wherein the connection zone is adjacent to the first component zone.

19. The semiconductor component as claimed in claim 16 formed as a MOSFET, in which the first component zone forms a drain zone and the second component zone forms a body zone and comprising:
- a source zone doped complementarily with respect to the body zone and separated from the drift zone by the body zone; and
- a gate electrode arranged adjacent to the body zone and insulated from the body zone by a gate dielectric.

20. A semiconductor component comprising:
- a first and a second component zone;
- a drift zone between the first and the second component zones, the drift zone comprising a first section and a second section;
- a drift control zone adjacent to the first section of the drift zone and spaced apart from the first component zone such that the second section of the drift zone in a current flow direction of the semiconductor component is configured between the drift control zone and the first component zone;
- a dielectric layer arranged between the drift zone and the drift control zone; and
- a first and a second connection zone forming a pn junction between the drift control zone and the second section of the drift zone.

* * * * *